United States Patent [19]
Weber

[11] Patent Number: 5,210,373
[45] Date of Patent: May 11, 1993

[54] SCREENING COMPARTMENT HAVING A CARRYING SANDWICH STRUCTURE

[75] Inventor: Hartwin Weber, Hanau, Fed. Rep. of Germany

[73] Assignee: Vacuumschmelze GmbH, Fed. Rep. of Germany

[21] Appl. No.: 756,041

[22] Filed: Sep. 6, 1991

[30] Foreign Application Priority Data

Sep. 18, 1990 [DE] Fed. Rep. of Germany ....... 4029498

[51] Int. Cl.⁵ .................................................. H05K 9/00
[52] U.S. Cl. ................................. 174/35 MS; 428/615
[58] Field of Search ....................... 428/612, 621, 680; 174/35 R, 35 MS; 361/424

[56] References Cited

U.S. PATENT DOCUMENTS

| | | | |
|---|---|---|---|
| 4,327,967 | 5/1982 | Groth | 350/258 |
| 4,749,625 | 6/1988 | Obayashi et al. | 428/624 |
| 4,890,083 | 12/1989 | Trenkler et al. | 335/301 |
| 4,959,504 | 9/1990 | Yarger et al. | 174/35 MS |

FOREIGN PATENT DOCUMENTS 2446986 4/1976 Fed. Rep. of Germany.

OTHER PUBLICATIONS

K. J. Best and J. Bork in ETZ, vol. 110, No. 16, (1989), pp. 814-819.

*Primary Examiner*—Leo P. Picard
*Assistant Examiner*—Bot Ledinh
*Attorney, Agent, or Firm*—Hill, Steadman & Simpson

[57] ABSTRACT

An apparatus for screening a magnetic field including a number of panels having a panel core of carrier material and at least one screening layer of soft magnetic material adhered to the panel core, where adjacent panels are secured in rigid, load-bearing relation to one another.

14 Claims, 1 Drawing Sheet

SCREENING COMPARTMENT HAVING A CARRYING SANDWICH STRUCTURE

BACKGROUND OF THE INVENTION

1. Field of the Invention

The present invention relates generally to an apparatus for screening magnetic and/or electromagnetic fields, and specifically to such apparatus that are composed of a plurality of panels, constructed of layers of soft-magnetic material having an initial permeability of more than 3,000, and optionally of additional metallic or non-metallic layers.

2. Description of the Related Art

German OS 24 46 986 describes an apparatus for screening electromagnetic material in a walk-in compartment. The compartment is formed with pre-fabricated, completely annealed sheets of a soft-magnetic nickel-iron alloy that are glued onto a wood cell lined with plywood. One disadvantage of this structure is that stresses in the highly sensitive magnetic material occur due to the gluing of the screening plates onto plywood. Such stresses lower the permeability values of the magnetic material.

OS 24 46 986 proposes to mitigate these stress problems by providing a supporting skeleton in which all load-bearing members are screwed to one another. The inside of the skeleton is then lined with deep-drawn sheets of carrier material in order to obtain optimally planar wall surfaces. The actual screening plates disclosed are preferably composed of a nickel-iron alloy that contains 70 through 82 weight percent nickel, 0 through 11 weight percent copper, 0 through 6 weight percent molybdenum, 0 through 6 weight percent chromium, the remainder iron, whereby the iron content amounts to at least 9 weight percent. The prefabricated screening plates have exemplary dimensions of 2500 mm ×380 mm×2 mm, and are completely annealed in an annealing furnace. The walls, ceiling, and floor of the space to be screened are then covered cross-wise with two layers of screening plates. The two sub-layers of magnetic screening material are then secured to the deep-drawn sheets with hollow blind riveting, in order to gently join the highly permeable screening plates to one another.

A publication of K. J. Best and J. Bork, in ETZ, Vol. 110, No. 16, pages 814ff (1989), describes screening compartments that are also based on the principle of sub-layer systems of highly permeable magnetic material laid cross-wise to one another. Different materials are employed in each shell of the three-shell standard compartment described therein. The respective individual shells are composed of highly permeable magnetic material and of highly electrically conductive material (i.e., aluminum). The magnetic walls are constructed of large panels, with the afore-mentioned strips of magnetic material overlapping one another cross-wise on the panel surfaces. The entire structure is in turn held by a framework of lightweight structural members. This publication emphasizes that the highly permeable magnetic material must be protected against mechanical overstressing.

The Best publication also describes a "special project": a screening compartment that has a seven-shell structure. In this compartment, the six outer shells are composed of mu metal and the inner shell is composed of copper. The compartment does not use a carrier system, since the shells are supported against one another by non-magnetic intermediate layers. The need for optimally great rigidity, particularly dynamic rigidity, is of special significance in multi-panel screening compartments. Greater rigidity decreases the microphone effects due to panel edge oscillations. The vibration-free suspension of measuring instruments (for example, of a SQUID with a mount at the compartment ceiling) is also of significance. The increasing use of highly sensitive measuring systems serves to emphasize the need for more rigid compartment structures.

Attempts were made in the screening compartment described in the Best publication to take the known stress-sensitivity of soft-magnetic material into consideration, with the conclusion that it was optimal to "separate" the screening material from the supporting structure. The publication refers to a "floating" fastening, i.e. the screening material is only loosely secured to the structure (by hollow blind riveting, as described in German Published Application 24 46 986 upon which the screening compartments of the Best publication are based). The "floating" fastening ensures that the screening material does not bear any auxiliary loads or moments other than the dead weight of the screening material itself. The support load-bearing is performed by discrete carrier elements, or by non-magnetic intermediate layers.

SUMMARY OF THE INVENTION

It is therefore an object of the present invention to provide a screening compartment that is composed of prefabricated panels, whereby optimally great compartment rigidity is achieved in a simple assembly that eliminates the need for a supporting framework to bear the static support loads, thereby also reducing manufacturing costs.

These and other objects are achieved in that the panels are constructed in a "sandwich" configuration having a panel core of carrier material, preferably of a honeycomb structure, and having at least one screening layer of the soft-magnetic material adhered to the panel core. The panels are joined to one another so that the layers of soft-magnetic material carry a significant portion of the static support load. The panels therefore provide the entire support for the compartment and are capable of being mechanically loaded beyond the loading necessitated by the dead weight of the panels themselves.

High-permeability alloys, preferably of the permalloy-type, are used when building screening compartments to shield low-frequency, low-impedance electromagnetic disturbances. Typical of such alloys are nickel-iron based alloys that contain 70 through 80 weight percent nickel, at least 9 weight percent iron, up to 11 weight percent copper, up to 6 weight percent molybdenum, and up to 6 weight percent chromium. In addition to having a high permeability, these alloys also exhibit an existing stress-sensitivity of the magnetic properties. The relationship between internal stresses and the permeability is established by the following equation:

$$\mu = Bs^2/(9\pi \times \sigma_i \times \Delta\lambda),$$

where $\mu$ represents the permeability, Bs represents the saturation magnetization, $\sigma_i$ represents the internal stresses, and $\Delta\lambda$ represents the difference of the magnetostriction values in the respective crystallographic directions.

A known representative of these high-permeability alloys of the permalloy type is an alloy distributed under the trademark μ MUMETALL having a saturation induction Bs=8000 Gauss, and $\Delta\lambda = 2\times 10^{-6}$. A permeability of 30,000 through 50,000 can be achieved in screening compartments that include this material. In order to achieve this value, the internal stresses $\sigma_i$ should therefore not amount to more than 3 N/mm². Higher values lead to inner degradation of the magnetic properties. Given a modulus of elasticity of 200,000 N/mm², this means a maximum dilation of approximately $1\times 10^{-5}$.

Surprisingly, it has been found that, despite these demands and despite the known stress-sensitivity of the magnetic properties of these materials, it is possible to abandon the fundamental separation between magnetic function and carrying function in screening compartments that was previously thought to be inherent (e.g., as set forth in the Best publication).

In accordance with the principles of the present invention, the magnetic material is integrated into the structure, and also bears static support loads. The invention is based in part on the principle that high-permeability magnetic materials (such as the mu metal cited) have a comparatively high modulus of elasticity, with a simultaneously high mechanical damping. Magnetic materials having a modulus of elasticity greater than 170,000 N/mm² are preferable for use in the screening compartments of the present invention. The initial permeability should be greater than 3,000, and preferably greater than 10,000.

Given an identical surface area and weight of material, the sandwich structures of the present invention are more rigid in comparison to traditional framework structures. Although the high-permeability magnetic material is mechanically stressed in the screening compartments of the invention, this occurs in a defined and predictable way, particularly by comparison to the method of "floating" fastening. The use of the soft-magnetic material in the sandwich structure of the present invention leads to a more rigid compartment, and to a potential reduction in manufacturing costs and saving material. Addition cost advantages result from the simple assembly methods possible with such sandwich elements.

These and other objects and advantages will become apparent upon reference to the accompanying descriptions when taken in conjunction with the following drawings.

DETAILED DESCRIPTION OF THE PRESENTLY PREFERRED EMBODIMENTS

Sandwich structures are known in other contexts. Such structures are usually composed of a relatively firm and highly elastic material as a cover material (for example, aluminum alloys, steel or fiber-reinforced plastics), and of a lightweight core composed of a honeycomb structure (for example, aluminum-saturated paper, polyurethane foam, Styropor, trapezoidal sheets, or corrugated sheets). Sandwich structures have a high rigidity, so that their use in the present invention makes it possible to incorporate the high-permeability magnetic material required for the screening compartments by adhering the material to the sandwich structure without exceeding the critical value for internal stresses and the concomitant inner degradation of the magnetic properties that occur in known structures.

The magnetic materials can, for example, be adhered to the carrier material by known single-component or two-component adhesives, or with thermally activatable foils. As a result of the high modulus of elasticity of the high-nickel-content magnetic materials of the permalloy type that are preferably used, the sandwich structure becomes more rigid, and the resulting stresses become even lower and less critical.

Figure 1:
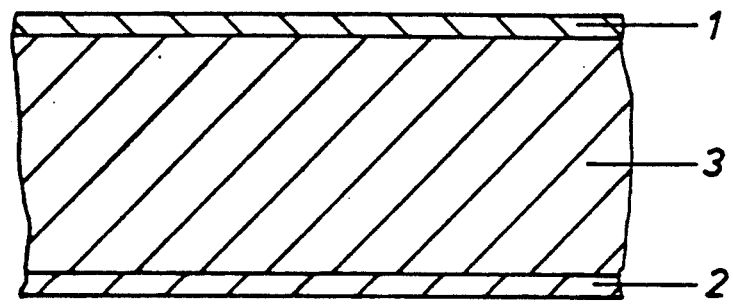
FIG. 1 illustrates a cross-sectional view of the structure of a sandwich element configured according to the principles of the present invention.

A panel employing the sandwich structure according to the principles of the present invention is illustrated in FIG. 1. Cover layers or screening layers 1 and 2 are adhered onto a panel core 3 composed of a lighter-weight material as carrier material. In screening compartments wherein a high screening effect over a greater frequency range is desired, it may be necessary to provide a conductivity shell in addition to the magnetic screening. Aluminum and copper are suitable highly conductive materials with aluminum being preferable. The conductive connection of these layers to the other sandwich elements may be accomplished by any suitable method, for example, by welding or with interference fits. A sandwich element having a conductive layer can, for example, be constructed such that the layer of highly electrically conductive material is arranged between the core and the screening layer of soft-magnetic material. All of the layers may be adhered to one another as described hereinabove.

In another preferred embodiment, particularly advantageous when the compartment is constructed with a conductivity shell, the high-permeability magnetic material may be adhered directly to the panel core of the carrier material.

Figure 2:
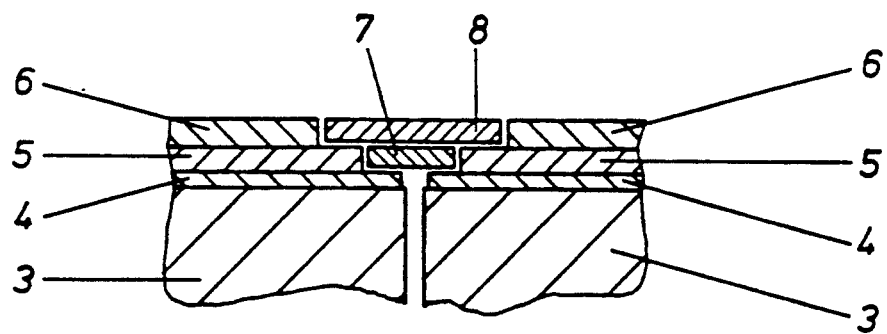
FIGS. 2 and 3 illustrate exemplary embodiments of an overlapping joining of the sandwich elements.
Figure 3:
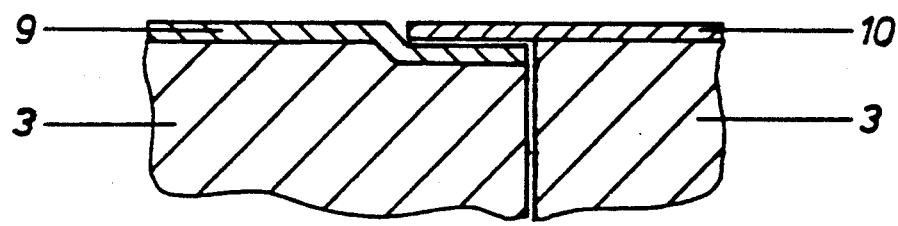

The individual panels must be assembled together to form the compartment so that the screening layers overlap one another, thus maintaining the integrity of the magnetic circuit formed by the screening layers. FIGS. 2 and 3 illustrate two suitable ways of joining the panels together. Referring to FIG. 2, a non-thickness dimension (length or width) of the individual layers 4, 5, and 6 of the panels decreases from the panel core 3 toward the outside. Fitting pieces 7 and 8 (that, for example, can be glued to the sandwich structures) are introduced into the remaining gaps.

Referring to FIG. 3, a cover layer 10 is composed of a single sheet. A screening layer 9 of the panel core 3 has a step-shaped course at one edge, whereas the cover layer 10 of the adjacent panel includes an extension member that extends beyond the edge of the panel core 3. The step-shaped indentation of the first panel is adapted to receive the extension member of the second panel when the panels are joined, thus insuring a gap-free overlap of the layers.

While preferred embodiments have been shown, modifications and changes may become apparent to those skilled in the art which shall fall within the spirit and scope of the invention. It is intended that such modifications and changes be covered by the attached claims.

What is claimed is:

1. An apparatus for screening a magnetic field comprising:
- a plurality of self-supporting panels;
- each of said plurality of self-supporting panels having a panel core of carrier material; and
- each of said plurality of self-supporting panels having at least one screening layer of soft-magnetic material adhered to said panel core, said self-supporting panels being arranged with adjacent panels secured in rigid, self-supporting load-bearing relation to one another, with said at least one screening layer of each of said plurality of self-supporting panels providing support for each of said plurality of self-supporting panels.

2. An apparatus according to claim 1, wherein said soft-magnetic material of said screening layer has a modulus of elasticity of more than 170,000 N/mm$^2$.

3. An apparatus according to claim 2, wherein said soft-magnetic material is composed of a nickel-iron based alloy that contains 70 through 82 weight percent nickel, more than 9 weight percent iron, 0 through 11 weight percent copper, 0 through 6 weight percent molybdenum, and 0 through 6 weight percent chromium.

4. An apparatus according to claim 1, wherein said screening layer is directly joined to the panel core by adhesion.

5. An apparatus according to claim 1, wherein each of said panels further comprises at least one conductive layer of electrically conductive material.

6. An apparatus according to claim 5, wherein said conductive layer is disposed between said panel core and said at least one screening layer; and wherein said at least one screening layer and said conductive layer are adhered to one another.

7. An apparatus according to claim 1, wherein said panel core of each panel has a predetermined length and width, and said at least one screening layer of each panel includes a plurality of screening layers comprising:
- a first screening layer, adjacent to said panel core, having a predetermined non-thickness dimension that is less than said pre-determined non-thickness dimension of said panel core; and
- at least one additional screening layer, adjacent to said first screening layer, having a predetermined non-thickness dimension that is less than said non-thickness dimension of said first screening layer.

8. An apparatus according to claim 1, wherein said at least one screening layer of each panel comprises a single screening layer having a step-shaped course at an edge region of at least one side thereof, and an extension member at an edge region of another side thereof, whereby said step-shaped courses are adapted to receive extension members of adjacent panels to ensure gap-free overlap of screening layers of adjacent panels.

9. An apparatus according to claim 1, wherein adjacent panels are adhered to one another.

10. An apparatus according to claim 1, wherein said panel core comprises a honeycomb structure.

11. An apparatus according to claim 1, wherein said soft magnetic material of said screening layer has an initial permeability of more than 3,000.

12. An apparatus according to claim 1, wherein each panel of said plurality of panels further comprises additional layers of metallic materials.

13. An apparatus according to claim 1, wherein each panel of said plurality of panels further comprises additional layers of non-metallic materials.

14. An apparatus for screening a magnetic field comprising:
- a plurality of panels;
- each panel of said plurality of panels having a panel core of carrier material; and
- each panel of said plurality of panels having at least one screening layer of soft-magnetic material adhered to said panel core, wherein said at least one screening layer of each panel includes a single screening layer having a step-shaped course at an edge region of at least one side thereof, and an extension member, complementary in shape to said step-shaped course, at an edge region of another side thereof, said step-shaped courses respectively receiving extension members of adjacent panels, each step-shaped course and an extension member received therein forming, in combination, means for securing adjacent panels in rigid, load-bearing relation to one another with gap-free overlap of screening layers of said adjacent panels.

* * * * *